United States Patent [19]

Ernsberger

[11] 4,155,735
[45] May 22, 1979

[54] ELECTROMIGRATION METHOD FOR MAKING STAINED GLASS PHOTOMASKS

[75] Inventor: Fred M. Ernsberger, Pittsburgh, Pa.

[73] Assignee: PPG Industries, Inc., Pittsburgh, Pa.

[21] Appl. No.: 856,054

[22] Filed: Nov. 30, 1977

[51] Int. Cl.² .................... C03C 15/00; C03C 17/00
[52] U.S. Cl. ........................... 65/30 E; 65/32; 65/60 R; 65/60 C; 204/130; 427/12; 427/38
[58] Field of Search ............... 65/30 E, 30 R, 60 C, 65/60 R, 32; 204/130; 427/38, 12

[56] References Cited

U.S. PATENT DOCUMENTS

| | | | |
|---|---|---|---|
| 2,314,804 | 3/1943 | Willson | 428/210 |
| 2,455,719 | 12/1948 | Weyl et al. | 428/141 |
| 2,468,402 | 4/1949 | Kreidl | 65/31 |
| 2,732,298 | 1/1956 | Stookey | 96/34 |
| 2,904,432 | 9/1959 | Ross et al. | 96/34 |
| 2,911,749 | 11/1959 | Stookey | 428/208 |
| 2,927,042 | 3/1960 | Hall et al. | 427/38 |
| 3,370,948 | 2/1968 | Rosenbauer | 96/36.2 |
| 3,489,624 | 1/1970 | Lake et al. | 156/15 |
| 3,508,982 | 4/1970 | Shearin | 156/3 |
| 3,510,371 | 5/1970 | Frankson | 156/652 |
| 3,515,587 | 6/1970 | Letter | 428/333 |
| 3,528,847 | 9/1970 | Grego et al. | 65/30 E X |
| 3,542,612 | 11/1970 | Kashau et al. | 156/13 |
| 3,551,304 | 12/1970 | Letter | 204/38 |
| 3,561,963 | 2/1971 | Kiba | 96/34.3 |
| 3,573,948 | 4/1971 | Tarnopol | 427/96 |
| 3,615,318 | 10/1971 | Jagodzinski et al. | 65/60 C X |
| 3,620,795 | 11/1971 | Kiba | 427/343 X |
| 3,622,295 | 11/1971 | Loukes et al. | 65/30 E |
| 3,650,720 | 3/1972 | Grego et al. | 65/30 E |
| 3,653,864 | 4/1972 | Rothermel et al. | 65/30 |
| 3,715,244 | 2/1973 | Szupillo | 148/31.5 |
| 3,720,515 | 3/1973 | Stanley | 96/38.4 |
| 3,732,792 | 5/1973 | Tarnopol et al. | 95/1 R |
| 3,754,913 | 8/1973 | Takeuchi et al. | 96/38.3 |
| 3,811,855 | 5/1974 | Carlson et al. | 65/30 |
| 3,816,222 | 6/1974 | Plumat et al. | 65/30 E X |
| 3,817,730 | 6/1974 | Uchida | 65/30 E |
| 3,836,348 | 9/1974 | Sumimoto et al. | 65/30 E |
| 3,857,689 | 12/1974 | Koizumi et al. | 65/30 |
| 3,879,183 | 4/1975 | Carlson | 65/30 |
| 3,880,630 | 4/1975 | Izawa | 65/30 |
| 3,896,016 | 7/1975 | Goodman et al. | 204/180 R |
| 3,902,882 | 9/1975 | Loukes et al. | 65/30 |
| 3,905,791 | 9/1975 | Plumat et al. | 96/36.2 |
| 3,905,818 | 9/1975 | Margrain | 96/36.2 |
| 3,907,566 | 9/1975 | Inoue et al. | 96/48 R |
| 3,933,609 | 1/1976 | Bokov | 264/180 R |
| 3,960,560 | 6/1976 | Sato | 96/36 |
| 3,967,040 | 6/1976 | Plumat et al. | 65/30 E X |
| 3,991,227 | 11/1976 | Carlson et al. | 427/39 |
| 3,991,228 | 11/1976 | Carlson et al. | 427/39 |
| 4,017,291 | 4/1977 | Gliemeruth | 65/60 C X |

OTHER PUBLICATIONS

Reports, Research Lab., Asahi Glass Company, Ltd., 25-1-(1975), pp. 51-55.
Coloured Glasses, W. A. Weyl, Society of Glass Technology, 1951, pp. 409-419.
Research, 11 (1958), pp. 461-465, "Coloured Patterns In Glass", A. J. C. Hall, and J. G. Hayes, Annual Review of Materials Science, 1976, pp. 267-301.
Journal of Applied Physics, vol. 34, No. 6, Jun. 1963, "Oxygen Outgassing Caused by Electron Bombardment of Glass", J. L. Lineweaver.
Scientific American, Sep. 1977, pp. 111-128, "The Fabrication of Microelectronic Circuits", W. G. Oldham.

Primary Examiner—S. Leon Bashore
Assistant Examiner—Frank W. Miga
Attorney, Agent, or Firm—Dennis G. Millman

[57] ABSTRACT

Glass photomasks having a stained pattern within the glass for use in photolithographic processes are made by exposing and developing a photoresist on a sheet of glass and subsequently migrating stain-producing ions, such as silver and/or copper, into the surface of the glass under the influence of an electric field and moderately elevated temperatures.

44 Claims, 28 Drawing Figures

ELECTROMIGRATION METHOD FOR MAKING STAINED GLASS PHOTOMASKS

BACKGROUND OF THE INVENTION

Photomasks are used in the art of photolithography for printing microelectronic circuits and other precision photofabricated parts, such as television shadow masks. In a photolithographic process a substrate is covered with a layer of photoresist in which a pattern is photographically developed by superimposing over the photoresist a photomask having patterned transparent and opaque areas, and then passing actinic radiation, especially ultraviolet light, through the transparent areas of the photomask. A pattern is then developed in the photoresist as a relief image by means of differential solubilities of the exposed and unexposed portions. The resulting image may be either a negative image or a positive image of the photomask, depending upon whether the photoresist is "negative-working" or "positive-working". Etching or other treatments may then be carried out on the underlying exposed portions of the substrate. A general discussion of the state of the art of photofabrication and the role played by photomasks may be found in *Scientific American*, September 1977, pages 111-128.

Since the preparation of a photomask can be laborious and costly, it is desirable for each photomask to be reused many times in the manufacture of photofabricated devices. Therefore, a photomask should be sufficiently durable to withstand extensive use, handling, and occasional cleaning without damage to the precision pattern it carries. It is also highly desirable to maximize the resolution of the pattern carried by a photomask so as to improve the accuracy of the image it imparts to the photofabricated devices being manufactured, which in turn permits further miniaturization of microcircuits and the like.

Photomasks in the prior art have typically consisted of sheets of glass carrying patterned coating on their surfaces. Photographic emulsion, iron oxide, and chromium are the films most commonly used. While iron oxide and chromium are considerably more durable than photographic emulsion coatings, all three, by their very nature as coatings, are susceptible to scratching and other damage which shortens the useful life of the photomasks. Also, the etching required to produce a desired pattern in iron oxide or chromium films entails a loss of resolution due to the so-called "etch factor," which means that an etched groove grows wider as it grows deeper. This may be lessened by reducing the film thickness, but with a sacrifice in durability. Moreover, chromium films have the drawbacks of being opaque, which is a disadvantage when aligning the photomask with the substrate being processed, and of being reflective, which causes undesirable light scattering.

Photomasks of improved durability were proposed in U.S. Pat. Nos. 3,573,948 to M. S. Tarnopol and 3,732,792 to M. S. Tarnopol et al., wherein instead of a coating on the surface of a glass sheet, the opaque areas of the photomask are produced by a stained pattern within the glass. While such stained glass photomasks represent a great improvement in durability, the degree of pattern resolution is less than what is desired for some applications. The limited resolution of the stained masks of the aforementioned patents arises from the necessity in one case to deeply etch the pattern through a stained layer of the glass, and in the other case to etch through a difficult-to-remove tin oxide coating, as well the tendency in all cases for a thermally migrated stain to spread laterally from the stained areas into the adjacent unstained areas during the staining process. A stained glass photomask is also shown in U.S. Pat. No. 3,561,963 to W. M. Kiba where the desired pattern is etched into a copper film on the glass substrate and copper ions are then migrated into the glass by heating. In U.S. Pat. No. 3,933,609 to J. S. Bokov et al. the photomask is made by staining the entire surface of a sheet of glass and then selectively etching away portions of the stained layer.

Attempts to minimize lateral diffusion of the staining ions within the glass are disclosed in U.S. Pat. Nos. 2,927,042 to A. J. C. Hall et al. and 3,620,795 to W. M. Kiba. In those patents, a film of a stain-producing metal is deposited onto the glass and patterned portions of the film are removed by photoetching. Ions from the remaining patterned film are then migrated into the glass to produce stained areas by applying an electric field through the glass in the desired direction of ion migration while maintaining the glass at an elevated temperature. Since resolution is reduced each time the pattern is transferred to a different material, it would be highly desirable to reduce the number of steps required for such processes.

SUMMARY OF THE INVENTION

It has now been found that a high resolution stained glass photomask may be made without the need for etching a metal film, thereby simplifying the process and reducing the chances for loss of resolution. In accordance with the present invention, electromigration under carefully selected conditions permits the use of a continuous layer of a source of stain-producing ions in combination with an organic photoresist to migrate stain-producing ions into predetermined, patterned zones of the glass surface. During the ion migrating step the use of an electric field of sufficient potential enables the use of temperatures below the point at which the organic photoresist begins to melt or decompose. Electromigration of the stain-producing ions will not take place in the areas of the glass underlying the photoresist due to the low electrical conductivity of the photoresist. Thus, electromigration of the stain-producing ions is limited to the portions of the glass underlying apertures through the photoresist which are photographically developed in the photoresist. In the exposed zones of the glass, cations from the continuous film (preferably silver and/or copper) are induced to migrate into the glass substantially perpendicularly to the surface of the glass due to the unidirectionally applied electric field. Within the glass, the stain-producing cations replace mobile cations of the base glass composition, especially alkali metal ions, which migrate deeper into the glass toward the cathode side of the electric field. Reducing the stain-producing ions to their elemental state and agglomerating them into submicroscopic crystals within the glass results in a visibly stained pattern within the body of the glass.

THE DRAWINGS

DETAILED DESCRIPTION

The substrates upon which the photomasks of the present invention are based are transparent sheets of glass. Composition of the glass is not critical so long as it contains mobile cations capable of being electromigrated at moderate voltages and which provide sites into which stain-producing ions may be injected. Alkali metal ions such as sodium, potassium and lithium have relatively high mobility in glass and thus, glasses having at least minor amounts of alkali metal oxides are particularly useful. For example, conventional soda-lime-silica flat glass compositions typically include about 10 to 13 percent by weight sodium oxide and often a trace of potassium oxide, which represents a more than ample supply of mobile cations for practicing the present invention. Borosilicate glass compositions having much lower alkali metal oxide concentrations have been used for coated photomask substrates and may be used with the present invention, provided that the stain intensity produced is adequate to suit the particular needs of the photomask user. Also usable are commercially available glass compositions formulated for enhanced ion exchange properties, and which are characterized by a substantial amount of aluminum oxide and/or zirconium oxide.

An important feature of the methods of the present invention is the use of photoresists. A photoresist may be defined as a resinous material which, upon exposure to actinic radiation (usually ultraviolet light), develops areas insoluble in a particular solvent and other areas which are soluble in that solvent. Since photoresists, their chemistry, and their methods of use are well known in the art, a detailed discussion is not deemed necessary here for an understanding of the present invention. For a detailed discussion of photoresists, reference may be had to *Annual Review of Materials Science*, 1976, edited by Huggins, Bube, and Roberts, Volume 6, pages 267 through 302.

Figure 1A:
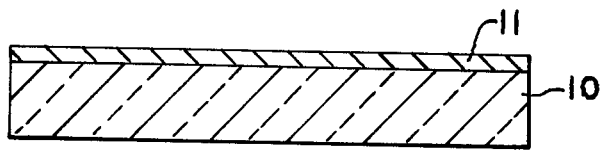
FIGS. 1 (*a* through *e*) shows schematically the process steps of one embodiment of producing a stained glass photomask by electromigrating through a photoresist applied over a film containing stain-producing cations.

Referring now to FIG. 1(a), there is shown a glass substrate 10 onto which a film 11, which serves as a source of stain-producing ions, has been applied. Stain producing ions which may be used include silver, copper, gold, and thallium, with silver being preferred. Film 11 may be applied as a compound of one or more of the stain-producing cations having relatively low electrical conductivity (e.g., AgCl), employing conventional coating techniques such as evaporation, sputtering, wet chemical deposition, or any other known technique, although it has been found that coatings of desirably high uniformity can be achieved by sputtering in particular.

Figure 1B:
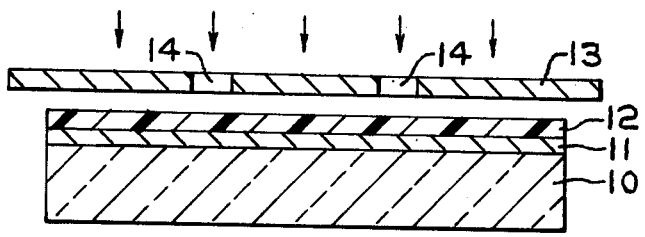
Figure 1C:
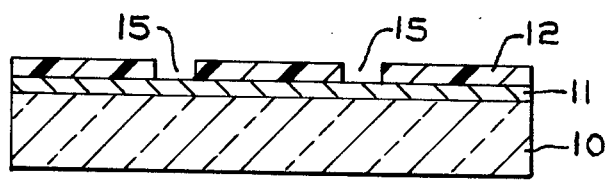

In FIG. 1(b), a layer of photoresist 12 has been applied over film 11 and is exposed to radiation through patterned apertures 14 in a master mask 13. When the photoresist 12 is then developed, a pattern of apertures 15 is produced in the photoresist, as shown in FIG. 1(c). The photoresist shown in all of the figures is a "positive-working" photoresist, so that the portions 15 which have been dissolved correspond to the patterned apertures 14 in the master mask while the remainder of the photoresist remains intact. It should be apparent that a "negative-working" photoresist could be used instead, in which case photoresist would remain only in the light-exposed areas after development. Specific examples of commercially available photoresists which may be used include "LSI-195" photoresist sold by Philip A. Hunt Co., "KPR" photoresist sold by Eastman Kodak Co., and "AZ-111" sold by Shipley Co.

Figure 1D:
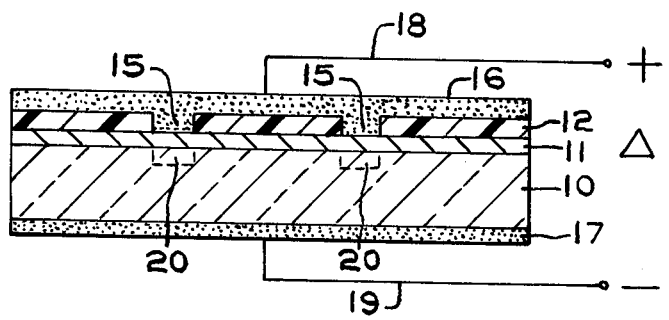

After the photoresist has been developed, the piece is ready for electromigration of the stain-producing ions into the glass as depicted in FIG. 1(d). Electrically conductive layers 16 and 17 are applied to opposite sides of the glass and serve as anode and cathode, respectively, when they are connected to a source of electrical potential by means of leads 18 and 19. Because it is easy to apply and remove, colloidal graphite is the preferred material for electrode layers 16 and 17. The colloidal graphite layers may be applied to the substrate in slurry form in which the colloidal graphite is suspended in an aqueous or alcoholic vehicle or the layers may be applied by means of commercially available aerosol sprays of colloidal graphite. Whatever material is used for the electrode layers 16 and 17, it must be applied sufficiently thick to render its resistance insignificant relative to the resistance of the glass (e.g., less than about 10%).

Imposing an electric field between the electrode layers 16 and 17, with layer 16 serving as the anode, causes a migration of mobile cations, especially alkali metal ions, out of zones 20 of the glass which underlie apertures 15 in the photoresist. These mobile cations are repelled by the anode and are thus driven deeper into the glass substrate. At the same time, the electric field causes the stain-producing ions from layer 11 to be injected into the glass in the patterned zones 20 where they take the places vacated by the migrated glass constituent ions. Because of the low electroconductivity of the photoresist, ion migration does not take place in the portions of the glass underlying the photoresist 12.

The rate of ion migration is influenced by temperature and the applied voltage. At room temperature and a potential of only a few volts, the rate of ion migration would be virtually imperceptible. Therefore, elevated temperatures, preferably above about 100° C., and a potential of at least a few hundred volts are preferred in order to obtain reasonable treatment times. Although photoresists are subject to melting and thermal decomposition at elevated temperatures, it has been found that the use of moderately elevated temperatures in combination with an electric field permits a satisfactory electromigration to be carried out without harming the photoresist. Thus, the temperature is maintained above about 100° C. but below the temperature at which the photoresist begins to melt or decompose, which is typically around 200° C., depending upon the particular photoresist being used. As an example, temperatures in the range of about 160° C. to about 200° C., together with a potential of about 300 volts to 400 volts, have been found to yield satisfactory results. Temperature and voltage are also interdependent since the conductivity of glass increases with increasing temperature, thereby lessening the voltage requirement. Thus, by selecting an appropriate combination of temperature and voltage, a practical rate of ion migration can be attained without requiring the use of deleteriously high temperatures or excessive voltages. It is necessary to avoid voltages so high as to cause arcing through the glass.

Figure 1E:
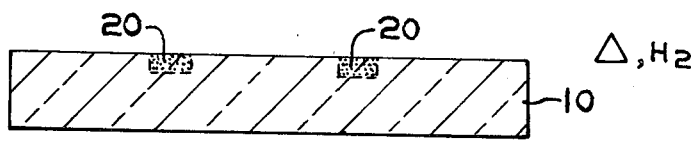
Figure 2A:
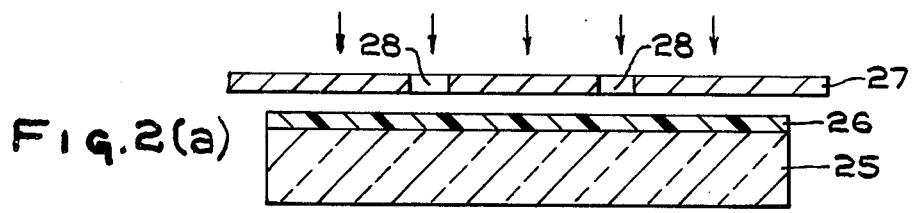
FIGS. 2 (a through d) shows schematically a sequence of steps in a preferred embodiment of the invention which is similar to that of FIG. 1, but with a layer containing stain-producing cations applied over a developed photoresist.
Figure 2B:
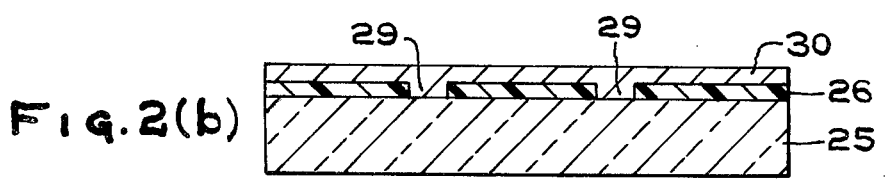
Figure 2C:
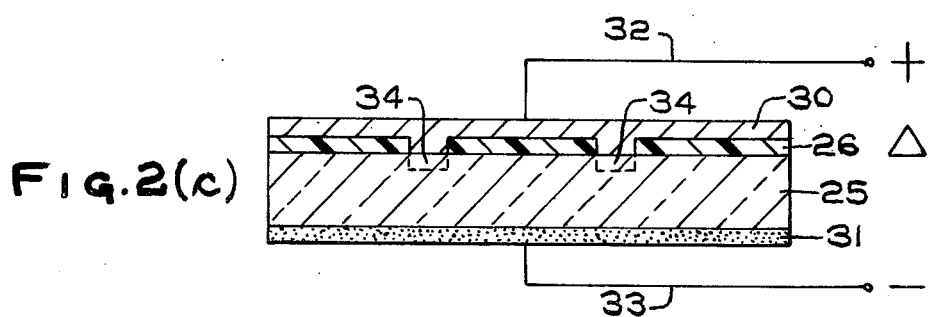
Figure 2D:
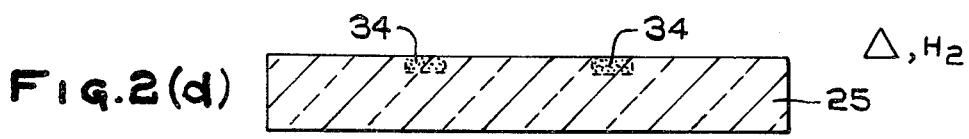

After the stain-producing ions have been electromigrated into the glass to the desired depth, all coatings may be removed from the glass substrate, thereby leaving nothing but a latent image within the glass substrate. As depicted in FIG. 1(e), development of coloration in the ion migrated zones 20 requires the application of heat in a reducing atmosphere to first reduce the stain-producing ions to their elemental state and then to agglomerate the metallic atoms into a submicroscopic crystalline form. These steps can be conveniently carried out, for example, by heating to at least about 200° C., preferably about 400° to 500° C., in an atmosphere containing hydrogen.

At some point of the process following the electromigration step, it may be desirable in some cases to subject the glass to a light etching so as to remove a thin layer of glass into which staining ions may have migrated beneath the photoresist as a result of current leakage through the photoresist. Any known glass etchant, such as dilute, aqueous hydrofluoric acid, may be used.

Due to the unidirectional influence of the electric field during the migration step, the stained zones 20 have been found to have very distinct boundaries, the sides extending nearly perpendicularly from the top surface of the glass. Also, the depth to which the stained zones extend into the glass appears to be quite uniform and distinct. The depth to which the stain extends into the glass is a function of the charge per unit area passed through the glass during the electromigration step. For a standard soda-lime-silica float glass, this depth has been found to be approximately 1 micron for each 0.1003 coulomb per square centimeter. The depth of stain desired will depend upon the particular requirement of a given application, in particular, the intensity of stain desired. A depth of about one micron, for example, may be sufficient in many cases to render the stained zones sufficiently absorbtive of ultraviolet radiation in contrast to the unstained areas. The stained areas of the photomask can be readily provided with a transmittance of less than 1% in the ultraviolet range of wavelengths (3,000 to 4,000 angstroms) most commonly used in photolithographic processes. At the same time, the stained areas remain sufficiently transparent in the visible wavelength spectrum (e.g., about 10% or more) to aid an operator in aligning the photomask with a substrate to be printed. The unstained areas of the photomask, or course, retain the radiation transmittance properties of the base glass from which it is made, which might typically be at least an order of magnitude more transparent that the stained areas in the ultraviolet range.

In the process of FIG. 1, as well as in some of the other embodiments, the need for a controlled, reducing atmosphere in the final step may be avoided if film 11, the source of stain-producing ions, also includes a reducing agent which can be migrated into the glass along with the stain-producing ions. With a reducing agent thus being made available within the glass, the reducing and agglomerating step may then be carried out by heating in air. A good reducing agent for the preferred silver ions are cuprous ions. In that case, film 11 may conveniently be a mixture of silver metal and copper metal.

An alternate, preferred procedure for carrying out the method of the present invention is shown in FIG. 2, which is similar to that of FIG. 1 except that the relative positions of a photoresist layer and a film of a staining ion source are inverted. In FIG. 2(a), a glass substrate 25 has a layer of photoresist 26 applied to its upper surface and is exposed to radiation through a mask 27 having patterned apertures 28. After the photoresist is developed, thereby removing portions 29 as shown in FIG. 2(b), a film 30 containing a source of staining ions is applied over the photoresist. Film 30 is preferably a metal or metal oxide or salt of a stain-producing cation, such as silver, copper, gold or thallium. The film may have either high or low electrical conductivity. In FIG. 2(c), electromigration is carried out in the same manner as described in connection with FIG. 1(d). An electrically conductive electrode layer 31 is applied to the opposite side of glass substrate 25 from the photoresist 26 and film 30, the electrode layer preferably being colloidal graphite. When film 30 has relatively low resistance, a separate electrode layer is not necessary, and electrical lead 32 may be connected directly to layer 30, which then serves as the anode. Electrical lead 33 is connected to electrode layer 31, which then serves as the cathode. The electromigration process produces ion migrated zones 34 within the glass, which may then be developed into stained patterns by heating in a reducing atmosphere, as shown in FIG. 2(d).

In FIG. 3, there is shown another embodiment of the present invention in which an entire surface of a glass substrate if pretreated with stain-producing ions, after which reducing ions are migrated into the glass surface in a predetermined pattern through a photoresist to produce a patterned stain in the glass. Such a technique avoids the need to reduce the stain-producing ions in a reducing atmosphere. In FIG. 3(a), a glass substrate 35 is shown with a layer 36 applied to one surface wherein the layer 36 is a source of stain-producing ions and may take the form of a metal or metal oxide or salt. As shown in FIG. 3(b), layer 36 may be a paste containing salts of the stain-producing ion. Silver is the preferred staining ion in this process since silver ions migrated into the glass can be readily reduced by a subsequent migration of copper ions into the glass. By bringing the substrate 35 and layer 36 to an elevated temperature as shown in FIG. 3(b), the silver ions or other stain-producing metal cations from layer 36 are fired into the glass, that is, the stain-producing ions migrate into a surface portions 37 of the glass where they displace mobile cations, such as alkali metal ions, from the glass matrix. The firing may take place under normal atmospheric conditions in an oven typically at about 400° C. to about 600° C., although higher temperatures up to the deformation point of the glass may be used. When the layer 36 is subsequently stripped from the glass, one surface of the glass has been sensitized to staining by virtue of the presence of the ion-migrated zone 37.

Figure 3A:
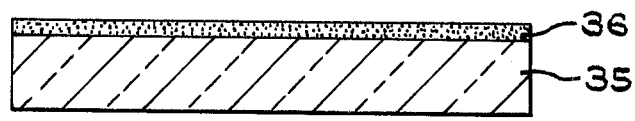
FIGS. 3 (a through e) shows schematically a sequence of steps in a variation of the process of the present invention wherein reducing ions are migrated through a developed photoresist to produce coloration within a pretreated sheet of glass.
Figure 3B:
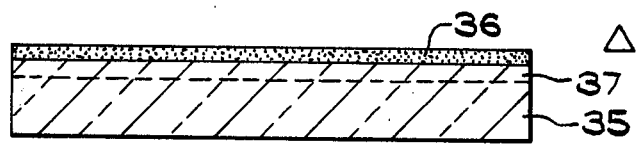
Figure 3C:
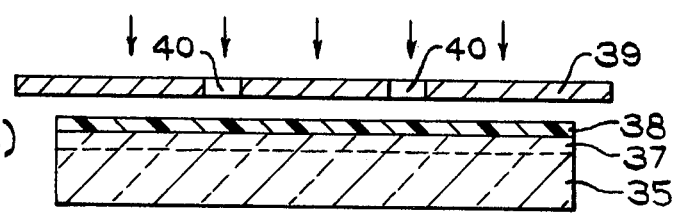
Figure 3D:
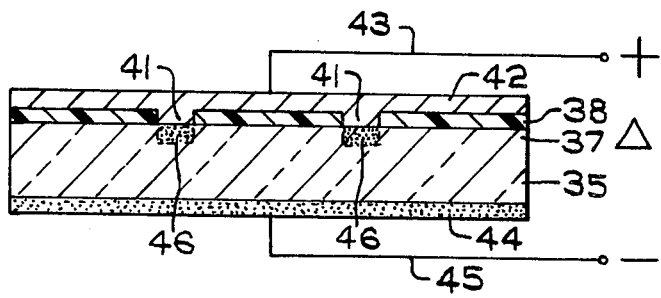
Figure 3E:
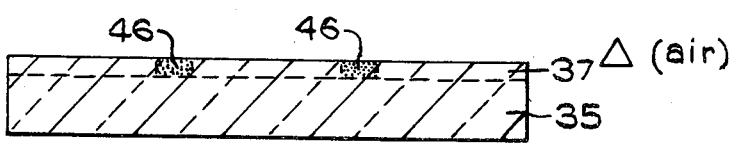

The desired stained photomask pattern may be imparted to the sensitized layer 37 by applying over the zone 37 a photoresist 38 as shown in FIG. 3(c). The photoresist is then exposed through apertures 40 in a master mask 39 and developed in the conventional manner to produce patterned openings 41 in the photoresist. As shown in FIG. 3(d), an electromigration process may then be carried out in the same manner as employed in the previous embodiments, but for the purpose of injecting reducing ions into the glass rather than stain-producing ions. A film 42, which includes a source of reducing ions, such as cuprous ions, is applied over the photoresist 38. Since film 42 is typically a conductive metal or metal oxide film, it may be connected directly by means of a lead 43 to the anode side of a source of electrical potential. The opposite side of the glass substrate has an electrically conductive electrode 44, such as colloidal graphite, applied thereto which serves as the cathode when connected by means of lead 45 to the source of electrical potential. Under the influence of the electric field and the moderately elevated temperatures of the electromigration process of the present invention as set forth above, the cuprous ions or other reducing ions from film 42 migrate into the sensitized zone 37 of the glass in the areas 46 which underlie openings 41 in the photoresist. There, the presence of the migrated reducing agent permits reduction of the stain-producing ions while the stain-producing ions underlying the remaining photoresist 38 are masked from the reducing action. After all coatings have been stripped from the glass substrate, the stain may be developed in zones 46 by heating in a non-reducing atmosphere to a sufficient temperature to agglomerate the stain-producing atoms. The remainder of the sensitized zone 37 outside the zones 46 remain unstained, but still sensitized to staining by subsequent processing, such as might be employed for repairing defects in a photomask.

In the example used to illustrate the method of FIG. 3, the migration of the silver stain-producing ions preceded the migration of the copper reducing ions because of the greater mobility of the silver ions in glass. In order to achieve a uniform reduction, the more mobile ion should be migrated first, whether it be the stain-producing ion or the reducing ion. Thus, when other combinations of stain-producing and reducing ions are used, the reducing ions may be migrated into the glass first, depending upon the relative mobility of the ions.

A procedure by which a glass substrate may be preconditioned with reducing ions is depicted in FIG. 4. An example of such a preconditioned glass is shown in FIG. 4(a) where glass substrate 50 is a sheet of float glass, that is, glass that has been formed in contact with a molten bath of tin. Such a piece of glass will have a surface zone 51 into which tin ions have migrated by contact with the molten tin bath. These tin ions present in the glass (predominately in the form of stannous oxide) can serve as reducing agents for either silver or copper stain-producing ions. The surface concentration of stannous oxide in ordinary commercially available float is usually sufficient to provide only a partial reducing action on the stain-producing ions, thereby yielding only a moderate degree of contrast between stained and unstained areas in the photomask. Thus, in some cases it may be desired to enhance the stannous ion concentration in a surface portion 51 of the glass. This may be accomplished in the float forming process itself by making the float bath atmosphere more oxidizing so as to induce the glass to absorb more tin, or by electrolytic means in the float bath. Another alternative for providing the desired concentration of stannous ions in glass is to melt a specialized glass composition which includes a substantial amount of stannous oxide throughout the body of the glass. A glass whose bulk composition included 1.9% by weight stannous oxide has been found to yield stained patterns having very satisfactory contrasts, and higher concentrations probably would not be required for most cases.

Figure 4A:
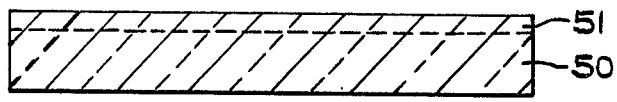
FIGS. 4 (a through e) shows schematically a series of steps in an alternate embodiment of the present invention wherein the glass is pretreated with a reducing agent and then stain-producing cations are migrated into the glass through a developed photoresist.
Figure 4B:
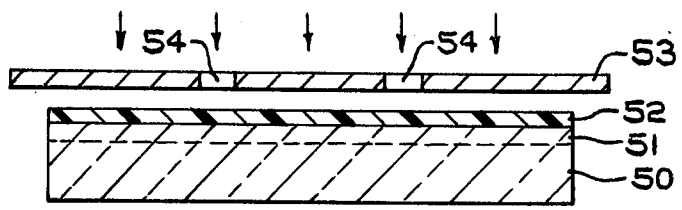
Figure 4C:
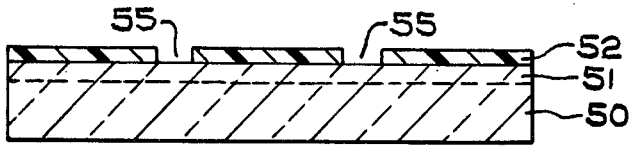
Figure 4D:
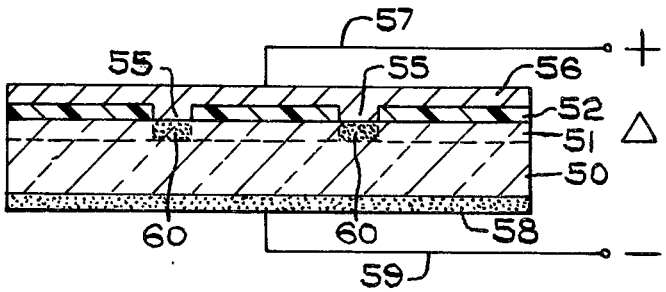
Figure 4E:
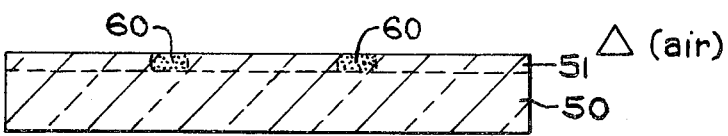
Figure 5A:
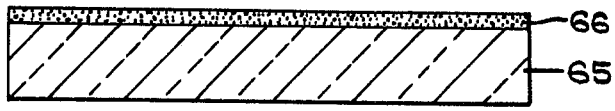
FIGS. 5 (a through e) shows schematically a series of steps in yet another alternate embodiment of the present invention wherein electromigration through a photoresist drives selected portions of stain-producing ions previously introduced into the glass deeper into the glass, thereby reducing the susceptibility of those portions to staining.
Figure 5B:
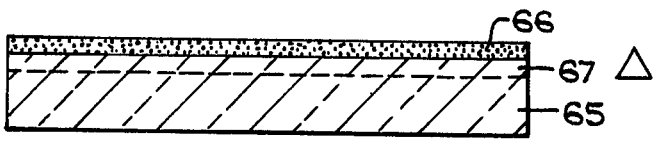
Figure 5C:
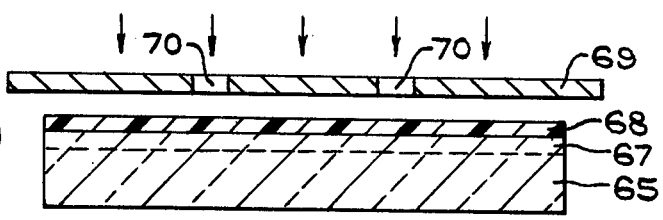
Figure 5D:
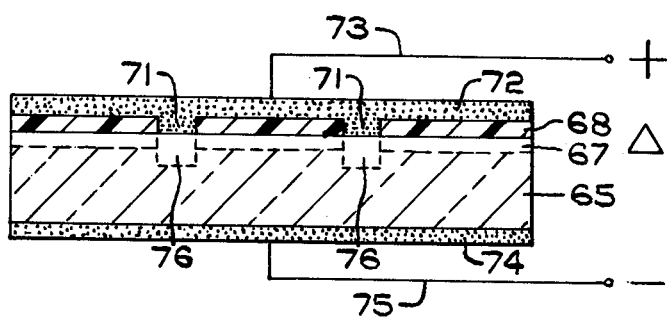
Figure 5E:
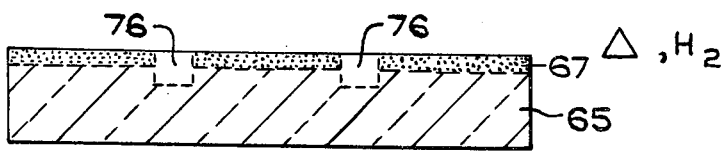
Figure 6A:
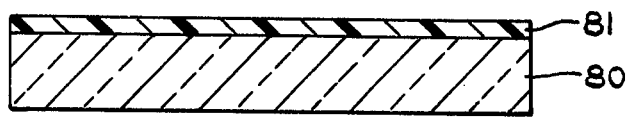
FIGS. 6 (a through d) illustrates another alternate embodiment of the process of the present invention wherein a molten salt layer is employed as a source of stain-producing cations.
Figure 6B:
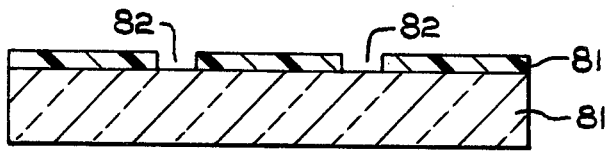
Figure 6C:
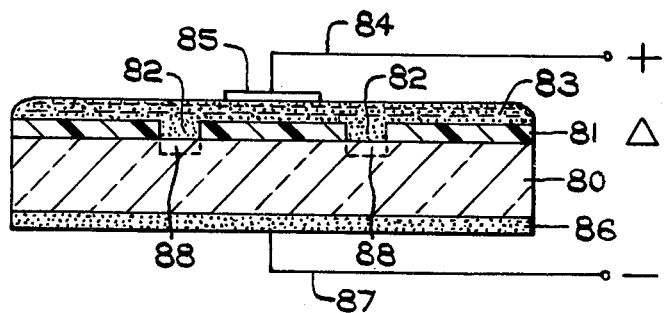
Figure 6D:
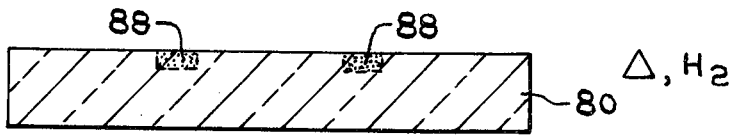

Having provided the desired concentration of tin ions in zone 51 of the glass substrate 50, developing the stained image in the glass may proceed in the same manner as the previously described embodiments of the present invention. First, a photoresist 52 is applied to the tin-containing side of the glass substrate and is exposed to radiation through a master mask 53 having patterned apertures 54 as shown in FIG. 4(b). The photoresist is then developed so as to provide patterned openings 55 therein as shown in FIG. 4(c). In FIG. 4(d), electromigration of stain-producing ions from a film 56 (preferably silver and/or copper) is shown. An electrical lead 57 is connected to the film 56 which then serves as the anode and an electroconductive layer 58, such as colloidal graphite, is applied to the opposite side of the glass and connected through lead 59 to the cathode side of a source of electrical potential. Under the influence of heat and the electrical field, the stain-producing ions migrate through openings 55 in the photoresist and enter the tin-containing zone 51 in the patterned areas 60. In the final step shown in FIG. 4(e), all layers and coatings have been removed and the ion-impregnated substrate is heated in an uncontrolled atmosphere to a temperature at which the stain-producing ions are reduced by the stannous ions and become agglomerated.

FIG. 5 represents a series of steps in another variation of the electromigration technique of the present invention wherein a differential ion migration depth yields stained patterns within the glass substrate. The first step, as shown in FIG. 5(a), is to apply to a surface of a glass substrate 65 a coating 66 which includes a source of stain-producing ions. Coating 66 may be a paste containing a salt of a stain-producing ion as shown, or it may be a metallic or metallic oxide film. The stain-producing ions may be caused to migrate into the surface zone 65 of the glass by heating the glass as shown in FIG. 5(b) or by any of the previously discussed techniques for migrating ions, such as electromigration. In FIG. 5(c), a photoresist 68 is shown applied to the ion-migrated surface of the glass substrate, the photoresist being developed by exposure to radiation through a master mask 69 having patterned apertures 70. Electromigration in FIG. 5(d) takes place through patterned openings 71 developed in the photoresist. Unlike the other embodiments, the electromigration step here does not serve to inject ions into the glass, but rather to migrate the stain-producing ions already present within the glass to a greater depth in selected areas of the glass. Thus, an electrode layer 72 is applied over the photoresist 68 and is selected to be a non-contributing electrode, that is, one which will not serve as a source of ions which would be injected into the glass during electromigration. The preferred material for use as a non-contributing electrode is colloidal graphite. The electrode layer 72 is connected by means of lead 73 to the anode side of an electrical potential and a cathode layer 74, also preferably colloidal graphite, is applied to the opposite side of the glass substrate and connected to the source of electrical potential by means of lead 75. Electromigration is limited to the portions of the glass underlying openings 71 in the photoresist and results in the creation of patterned zones 76 within the glass wherein the stain-producing ions from zone 67 are migrated deeper into the glass. It is hypotesized that the sites vacated by the stain-producing ions within zones 76 become occupied during electromigration by protons which dissociate from water molecules that diffuse through the porous graphite electrode layer 72. Thus, in the subsequent step of reducing the stain-producing ions to their metallic state by heating in the presence of a reducing agent such as hydrogen, as shown in FIG. 5(e), reduction takes place in the unmigrated surface zone 67, but does not take place to an appreciable extent in the more deeply migrated zones 76 since the stain-producing-ions there are beyond the depth of penetration of the reducing agent. Under the influence of heat, the reduced ions in zone 67 will agglomerate to form a colored stain, while the deeply migrated portions 76 remain relatively transparent. It may be noted that the stained pattern produced on the photomask by this process is a negative image of the patterns produced by the other embodiments disclosed herein.

FIG. 6 illustrates yet another manner in which stain-producing ions may be introduced into a glass surface in a preselected pattern through a photoresist. In this case, electromigration takes place from a molten salt layer. In FIG. 6(a), a glass substrate 80 is coated with a photoresist 81, which is then developed in the usual manner to produce a pattern of openings 82 as shown in FIG. 6(b). Some photoresists are subject to chemical attack by the molten salt used in this method, but examples of commercially available photoresists which were found to be resistant to such attack are: "Kodak KPR" photoresist and "Kodal KTFR" photoresist, both made by the Eastman Kodak Company, Rochester, New York. FIG. 6(c) shows a thin pool of molten salt 83 applied over the photoresist. The molten salt may be a mixture of salts, at least one of which is a salt of a stain-producing metal ion, the mixture of salts being selected so as to yield a melting point below the degradation temperature of the photoresist. An example of such a molten salt mixture having its melting point below 200° C. is the eutectic mixture of silver nitrate and potassium nitrate. An electrical lead 84 connects the molten salt as the anode to a source of electrical potential through a metal plate 85 submerged in the molten salt. The metal plate 85 may conveniently be the same as the stain-producing metal (e.g., silver). A cathode layer 86, preferably colloidal graphite, is connected to the source of electrical potential by way of lead 87 on the underside of the glass. The entire assembly is maintained above the melting point of the salt by carrying out the electromigration in a heated chamber or on a hot plate. Cations from the molten salt, including the stain-producing cations, migrate into the glass in zones 88 underlying openings 82 in the photoresist. In the final step shown in FIG. 6(d), the stain is developed in these ionmigrated zones 88 by exposure to heat and a reducing atmosphere.

While the preferred embodiments of the present invention rely on the combination of heat and an electric field to electromigrate through a photoresist, some of the advantages of the present invention may also be attained in the embodiment of FIG. 6 without using an electric field. Contact between the molten salt and the glass surface will establish an ion exchange between the salt and the glass ions. For example, sodium from the glass may pass into the salt and ions, such as silver and potassium, may pass from the salt into the sites vacated by the sodium within the glass. While such an ion exchange, unaided by an electric field, may be slower and may produce a lower degree of resolution, its simplicity may render it attractive for some applications.

Other modifications and variations as are known to those of skill in the art may be resorted to without departing from the spirit and scope of the invention as claimed by the appended claims.

I claim:

1. A method for making a stained glass photomask having improved resolution comprising:

applying to a first surface of a glass substrate a layer of a source of stain-producing cations;

applying onto said cation source layer a layer of organic photoresist;

placing a master mask over the photoresist layer, exposing patterned areas of the photoresist to actinic radiation through the master mask, and photographically developing the exposed photoresist, thereby producing a pattern of apertures through the organic photoresist layer;

applying a first electrode layer onto the organic photoresist layer and into contact with the portions of the cation source layer exposed by the apertures in the photoresist layer, and applying a second electrode layer onto the glass surface on the opposite side of the glass substrate from said first surface;

simultaneously heating the coated composite consisting essentially of the glass substrate, the source layer of stain-producing cations, the apertured organic photoresist layer, and the electrode layers to at least 100° C. while applying a direct current electric field between said first and second electrodes, with the first electrode as anode and the second electrode as cathode, so that electric charge passes through the apertures in the organic photoresist layer and induces migration of stain-producing cations from the cation source layer into portions of the glass underlying said apertures, and passage of electric charge is blocked by the organic photoresist layer so that the areas of the glass underlying the organic photoresist remain substantially free from migrated stain-producing cations;

removing said electrode layers, organic photoresist layers, and cation source layer from the glass substrate, and heating the glass in the presence of a reducing agent so as to reduce and agglomerate the migrated stain-producing cations within the glass, thereby producing a stained pattern within the surface of the glass.

2. The method of claim 1 wherein the step of applying a layer of a source of stain-producing cations onto the substrate comprises depositing a film which includes a stain-producing cation selected from the group consisting of silver, copper, gold and thallium onto the substrate.

3. The method of claim 1 wherein the step of simultaneously heating and applying an electric field is carried out at a temperature from 100° C. to 200° C.

4. The method of claim 1 wherein the step of simultaneously heating and applying an electric field is carried out at a temperature from 160° C. to 200° C.

5. The method of claim 1 wherein the step of applying a layer of a source of stain-producing cations onto the substrate comprises depositing a metal or metal oxide film onto the substrate.

6. The method of claim 1 wherein the step of applying an electrode layer onto the substrate comprises depositing a coating of colloidal graphite onto the substrate.

7. The method of claim 1 wherein the step of heating and reducing the migrated cations comprises heating the glass while in contact with a reducing atmosphere.

8. The method of claim 1 wherein the step of heating and reducing the migrated cations comprises heating the glass while in contact with air, and the migrated cations are reduced by ions present within the glass.

9. The method of claim 1 further comprising, after the stain-producing cations have been migrated into the glass and prior to the heating and reducing step, migrating into the glass additional ions having a reducing potential toward the stain-producing cations.

10. The method of claim 1 wherein said step of applying a layer of a source of stain-producing cations onto the surface comprises depositing a film containing silver onto the substrate, and wherein said reduction of the migrated stain-producing cations within the glass comprises reducing silver ions by means of copper ions present within the glass.

11. The method of claim 1 wherein said step of applying a layer of a source of stain-producing cations onto the substrate comprises depositing onto the substrate a film containing a member of the group consisting of silver, copper and mixtures thereof, and wherein said reduction of the migrated stain-producing cations within the glass comprises reducing the cations with tin ions present within the glass.

12. The method of claim 1 wherein the steps of applying a stain-producing cation source layer and an organic photoresist layer onto the substrate comprise applying both of said layers in superimposed relationship onto a surface of a sheet of float glass which has an enhanced tin concentration due to contacting tin in the forming process.

13. The method of claim 1 wherein the steps of applying a stain-producing cation source layer and an organic photoresist layer onto the substrate comprises applying both of said layers in superimposed relationship onto a glass surface including more than about 4 percent by weight stannous oxide.

14. A method for making a stained glass photomask having improved resolution comprising:
  applying onto a first surface of a glass substrate a layer of organic photoresist;
  placing a master mask over the organic photoresist layer, exposing patterned areas of the photoresist to actinic radiation through the master mask, and photographically developing the exposed photoresist, thereby producing a pattern of apertures through the organic photoresist layer;
  applying onto said apertured organic photoresist layer and into the apertures therein, a layer of a source of stain-producing cations;
  applying an electrode layer onto the glass surface on the opposite side of the glass substrate from said first surface;
  connecting said electrode layer to the cathode side of a source of electrical potential and said cation source layer to the anode side of a source of electrical potential and simultaneously heating the coated composite consisting essentially of the glass substrate, the source layer of stain-producing cations, the apertured organic photoresist layer, and the electrode layer to at least 100° C. while applying a direct current electric field between said cation source layer and the electrode layer, so that electric charge passes through the apertures in the organic photoresist and induces migration of stain-producing cations from the cation source layer into portions of the glass underlying said apertures, and passage of electric charge is blocked by the organic photoresist layer so that the areas of the glass underlying the organic photoresist remain substantially free from migrated stain-producing cations;
  removing said electrode layer, organic photoresist layer, and cation source layer from the glass substrate; and
  heating the glass, in the presence of a reducing agent so as to reduce and agglomerate the migrated stain-producing cations within the glass, thereby producing a stained pattern within the surface of the glass.

15. The method of claim 14 wherein the step of applying a layer of a source of stain-producing cations onto the substrate comprises placing a molten pool of a salt containing said stain-producing cations onto the substrate.

16. The method of claim 14 wherein the step of applying a layer of a source of stain-producing cations onto the substrate comprises depositing a film which includes a stain-producing cation selected from the group consisting of silver, copper, gold and thallium onto the substrate.

17. The method of claim 14 wherein the step of simultaneously heating and applying an electric field is carried out at a temperature from 100° C. to 200° C.

18. The method of claim 14 wherein the step of simultaneously heating and applying an electric field is carried out at a temperature from 160° C. to 200° C.

19. The method of claim 14 wherein the step of applying a layer of a source of stain-producing cations onto the substrate comprises depositing a metal or metal oxide film onto the substrate.

20. The method of claim 14 wherein the step of applying an electrode layer onto the substrate comprises depositing a coating of colloidal graphite onto the substrate.

21. The method of claim 14 wherein the step of heating and reducing the migrated cations comprises heating the glass while in contact with a reducing atmosphere.

22. The method of claim 14 wherein the step of heating and reducing the migrated cations comprises heating the glass while in contact with air, and the migrated cations are reduced by ions present within the glass.

23. The method of claim 14 further comprising, after the stain-producing cations have been migrated into the glass and prior to the heating and reducing step, migrating into the glass additional ions having a reducing potential toward the stain-producing cations.

24. The method of claim 14 wherein said step of applying a layer of a source of stain-producing cations onto the surface comprises depositing a film containing silver onto the substrate, and wherein said reduction of the migrated stain-producing cations within the glass comprises reducing silver ions by means of copper ions present within the glass.

25. The method of claim 14 wherein said step of applying a layer of a source of stain-producing cations onto the substrate comprises depositing onto the substrate a film containing a member of the group consisting of silver, copper and mixtures thereof, and wherein said reduction of the migrated stain-producing cations within the glass comprises reducing the cations with tin ions present within the glass.

26. The method of claim 14 wherein the steps of applying a stain-producing cation source layer and an organic photoresist layer onto the substrate comprise applying both of said layers in superimposed relationship onto a surface of a sheet of float glass which has an enhanced tin concentration due to contacting tin in the forming process.

27. The method of claim 14 wherein the steps of applying a stain-producing cation source layer and an organic photoresist layer onto the substrate comprises applying both of said layers in superimposed relationship onto a glass surface including more than about 4 percent by weight stannous oxide.

28. A method for making a stained glass photomask having improved resolution comprising:
   applying a layer of a source of stain-producing cations onto a first surface of a glass substrate;
   uniformly migrating stain-producing cations from said cation source layer into the first surface of the substrate to a first depth while heating the glass;
   removing the cation source layer from the glass surface;
   applying a layer of organic photoresist over the ion-injected first surface of the glass;
   placing a master mask over the photoresist layer, exposing patterned areas of the photoresist to actinic radiation through the master mask, and photographically developing the exposed photoresist, thereby producing a pattern of apertures through the organic photoresist layer;
   applying a first electrode layer over the organic photoresist layer and the apertures therein and applying a second electrode layer onto the glass surface on the opposite side of the glass substrate from said first surface;
   simultaneously heating the composite consisting essentially of the glass substrate, the apertured organic photoresist layer, and the electrode layers to at least 100° C. while applying a direct current electric field between said first and second electrodes, with the first electrode as anode and the second electrode as cathode, so that electric charge passes through the apertures in the organic photoresist layer and induces migration of stain-producing cations within the glass from said first depth deeper into the glass to a second depth in the portions of the glass underlying the apertures in the photoresist, and passage of electric charge is blocked by the organic photoresist layer so that substantially no additional migration of stain-producing ions beyond said first depth takes place in the portions of the glass underlying the organic photoresist;
   removing the electrode layers and the photoresist layer from the glass surfaces; and
   heating the substrate in the presence of a reducing agent so as to reduce and agglomerate the stain-producing ions within the glass above said first depth, and discontinuing the reduction before stain-producing ions deeper within the glass than said first depth become reduced, thereby producing a stained pattern within the glass.

29. The method of claim 28 wherein the step of applying a layer of a source of stain-producing cations onto the substrate comprises depositing a film which includes a stain-producing cation selected from the group consisting of silver, copper, gold and thallium onto the substrate.

30. The method of claim 28 wherein the step of simultaneously heating and applying an electric field is carried out at a temperature from 100° C. to 200° C.

31. The method of claim 28 wherein the step of simultaneously heating and applying an electric field is carried out at a temperature from 160° C. to 200° C.

32. The method of claim 28 wherein the step of applying a layer of a source of stain-producing cations onto the substrate comprises depositing a metal or metal oxide film onto the substrate.

33. The method of claim 28 wherein the step of applying a layer of a source of stain-producing cations onto the substrate comprises placing a molten pool of a salt containing said stain-producing cations onto the substrate.

34. The method of claim 28 wherein the step of applying an electrode layer onto the substrate comprises depositing a coating of colloidal graphite onto the substrate.

35. The method of claim 28 wherein the step of heating and reducing the migrated cations comprises heating the glass while in contact with a reducing atmosphere.

36. The method of claim 28 wherein the step of heating and reducing the migrated cations comprises heating the glass while in contact with air, and the migrated cations are reduced by ions present within the glass.

37. The method of claim 28 further comprising, after the stain-producing cations have been migrated into the glass and prior to the heating and reducing step, migrating into the glass additional ions having a reducing potential toward the stain-producing cations.

38. The method of claim 28 wherein said step of applying a layer of a source of stain-producing cations onto the surface comprises depositing a film containing silver onto the substrate, and wherein said reduction of the migrated stain-producing cations within the glass comprises reducing silver ions by means of copper ions present within the glass.

39. The method of claim 28 wherein said step of applying a layer of a source of stain-producing cations onto the substrate comprises depositing onto the substrate a film containing a member of the group consisting of silver, copper and mixtures thereof, and wherein said reduction of the migrated stain-producing cations within the glass comprises reducing the cations with tin ions present within the glass.

40. The method of claim 28 wherein the steps of applying a stain-producing cation source layer and an organic photoresist layer onto the substrate comprise applying both of said layers in superimposed relationship onto a surface of a sheet of float glass which has an enhanced tin concentration due to contacting tin in the forming process.

41. The method of claim 28 wherein the steps of applying a stain-producing cation source layer and an organic photoresist layer onto the substrate comprises applying both of said layers in superimposed relationship onto a glass surface including more than about 4 percent by weight stannous oxide.

42. A method for making a stained glass photomask comprising:

applying a layer of organic photoresist over a first surface of a sheet of glass;

placing a master mask over the photoresist layer, exposing patterned areas of the photoresist to actinic radiation through the master mask, and photographically developing the exposed photoresist, thereby producing a pattern of apertures through the organic photoresist layer;

applying a layer of molten salt containing stain-producing cations onto the photoresist and into contact with portions of the glass through said apertures in the photoresist and maintaining the composite consisting essentially of the glass substrate, the apertured organic photoresist, and the molten salt at an elevated temperature so as to induce migration of stain-producing cations from the molten salt into portions of the glass underlying said apertures;

removing the molten salt and the photoresist from the glass surface; and heating the glass in the presence of a reducing agent so as to reduce and agglomerate the stain-producing ions migrated within the glass so as to form a stained pattern within the glass.

43. The method of claim 42 wherein the step of applying a molten salt containing stain-producing cations onto the photoresist and the apertures comprises applying onto the photoresist and the apertures a molten salt mixture of silver salts and potassium salts.

44. The method of claim 42 wherein the step of applying a molten salt onto the photoresist and the apertures comprises applying onto the photoresist and the apertures a eutectic mixture of silver nitrate and potassium nitrate.

* * * * *